(12) United States Patent
Zhai

(10) Patent No.: US 10,283,575 B2
(45) Date of Patent: May 7, 2019

(54) DISPLAY PANEL AND DISPLAY DEVICE

(71) Applicant: SHANGHAI TIANMA MICRO-ELECTRONICS CO., LTD., Shanghai (CN)

(72) Inventor: Yingteng Zhai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 9 days.

(21) Appl. No.: 15/795,898

(22) Filed: Oct. 27, 2017

(65) Prior Publication Data

US 2018/0069054 A1 Mar. 8, 2018

(30) Foreign Application Priority Data

Apr. 27, 2017 (CN) .......................... 2017 1 0285802

(51) Int. Cl.
G06F 3/044 (2006.01)
G06F 3/0354 (2013.01)
H01L 29/66 (2006.01)
G03F 1/24 (2012.01)
G06F 3/041 (2006.01)
H01L 27/32 (2006.01)
H01L 25/18 (2006.01)
(Continued)

(52) U.S. Cl.
CPC ............ *H01L 27/323* (2013.01); *G06F 3/041* (2013.01); *G06F 3/0412* (2013.01); *G06F 3/0416* (2013.01); *H01L 25/18* (2013.01); *H01L 27/1255* (2013.01); *H01L 27/3262* (2013.01); *H01L 27/3276* (2013.01); *H01L 51/5253* (2013.01)

(58) Field of Classification Search
CPC combination set(s) only.
See application file for complete search history.

(56) References Cited

U.S. PATENT DOCUMENTS

2011/0069036 A1* 3/2011 Anno ................. G06F 3/03545
345/174
2011/0266140 A1* 11/2011 Kinoshita ................ G03F 1/24
204/192.27
(Continued)

FOREIGN PATENT DOCUMENTS

CN 205944094 U 2/2017

*Primary Examiner* — Lin Li
(74) *Attorney, Agent, or Firm* — Alston & Bird LLP

(57) ABSTRACT

A display panel and a display device are provided. The display device includes an array substrate; an organic light emitting layer including a second electrode; a thin film encapsulation layer cladding the organic light emitting layer; a touch electrode. A projection on the array substrate of part of a border of the second electrode/thin film encapsulation layer has a concave-convex outline. The concave-convex outline includes convex portions and concave portions. The convex portions of the second electrode are electrically connected with first metal wires in the array substrate via first through holes. Perpendicular projections on the array substrate of the second through holes are not overlapped with that on the array substrate of the thin film encapsulation layer; the perpendicular projections on the array substrate of at least part of the second through holes are in that on the array substrate of the concave portions of the thin film encapsulation layer.

16 Claims, 9 Drawing Sheets

(51) Int. Cl.
    *H01L 27/12*     (2006.01)
    *H01L 51/52*     (2006.01)

(56) References Cited

U.S. PATENT DOCUMENTS

| | | | |
|---|---|---|---|
| 2012/0032927 A1* | 2/2012 | Kim | G06F 3/044 |
| | | | 345/176 |
| 2013/0161711 A1* | 6/2013 | Nam | H01L 29/66181 |
| | | | 257/296 |
| 2014/0184527 A1* | 7/2014 | Kim | G06F 3/044 |
| | | | 345/173 |
| 2016/0266675 A1* | 9/2016 | Yang | G06F 3/0412 |
| 2017/0003822 A1* | 1/2017 | Zhao | G06F 3/0412 |
| 2017/0024060 A1* | 1/2017 | Seong | G06F 3/044 |

* cited by examiner

DISPLAY PANEL AND DISPLAY DEVICE

CROSS-REFERENCE TO RELATED APPLICATIONS

This application claims priority to Chinese patent application No. CN201710285802.5 filed on Apr. 27, 2017, the disclosure of which is incorporated herein by reference in its entirety.

TECHNICAL FIELD

Embodiments of the present disclosure relate to the technical field of display, and particularly relate to a display panel and a display device.

BACKGROUND

An organic light emitting display (OLED) gets extensive attention due to various advantages such as self-luminescence, high contrast, low power consumption, extremely high reaction speed and the like, and is regarded as the development direction of a next generation of display technology.

FIG. 1A is a schematic top view illustrating the OLED in the existing art. FIG. 1B is a schematic cross sectional view along line A-A' in FIG. 1A. Referring to FIG. 1A and FIG. 1B, the display includes an array substrate 100, an anode layer (not shown), an organic functional layer 200, a cathode layer 300, a thin film encapsulation layer 400 and a touch electrode layer 500. The cathode layer 300 is electrically connected with metal wires in the array substrate 100 via through holes 700. The touch electrode layer 500 is electrically connected with the metal wires in the array substrate 100 via through holes 600. To avoid damaging the thin film encapsulation layer 400, the through holes 600 through which the touch electrode layer 500 is electrically connected need to be formed outside the thin film encapsulation layer 400. As shown in the figure, the through holes 600 are arranged at both sides of the thin film encapsulation layer 400. Accordingly, a large frame is occupied so that the frame of the OLED is large.

SUMMARY

The present disclosure provides a display panel and a display device to realize a narrow frame of the display panel while ensuring reliable encapsulation of the display panel.

In a first aspect, embodiments of the present disclosure provide a display panel, including:

an array substrate;

an organic light emitting layer, the organic light emitting layer is disposed on one side of the array substrate, and includes a second electrode;

a thin film encapsulation layer, the thin film encapsulation layer is disposed on one side, facing away from the array substrate, of the organic light emitting layer, and dads the organic light emitting layer; and a touch electrode disposed on one side, facing away from the array substrate, of the thin film encapsulation layer, a border of the second electrode and a border of the thin film encapsulation layer both have a concave-convex outline, the concave-convex outline comprises convex portions and concave portions, and the convex portions of the second electrode are electrically connected with first metal wires located in the array substrate via first through holes;

the touch electrode is electrically connected with second metal wires located in the array substrate via second through holes, and is configured to receive and/or transmit a touch signal through the second metal wires; and perpendicular projections on the array substrate of the second through holes are not overlapped with the perpendicular projection on the array substrate of the thin film encapsulation layer, and the perpendicular projections on the array substrate of at least a part of the second through holes are located in the perpendicular projections on the array substrate of the concave portions of the thin film encapsulation layer.

In a second aspect, embodiments of the present disclosure further provide a display device. The display device includes the display panel provided by any embodiment of the present disclosure.

According to the embodiments provided by the present disclosure, a projection on the array substrate of a part of the border of the second electrode and a projection on the array substrate of a part of the border of the thin film encapsulation layer have the concave-convex outline. The concave-convex outline includes the convex portions and the concave portions. The perpendicular projections on the array substrate of the second through holes are not overlapped with the perpendicular projection on the array substrate of the thin film encapsulation layer, and the perpendicular projections on the array substrate of at least a part of the second through holes are located in the perpendicular projections on the array substrate of the concave portions. When the second electrode is electrically connected with the first metal wires in the array substrate via the through holes, position regions of the second through holes correspond to the concave portions of the thin film encapsulation layer. The second through holes keep away from the convex portions of the thin film encapsulation layer, and do not penetrate through the thin film encapsulation layer. Since the second through holes do not penetrate through the thin film encapsulation layer, i.e., no hole is formed in the thin film encapsulation layer, the reliable encapsulation of the thin film encapsulation layer is ensured. Moreover, since positions of the second through holes correspond to the concave portion regions of the thin film encapsulation layer and a region of the frame occupied by the second through holes is partially overlapped with the region of the frame occupied by the thin film encapsulation layer, the frame is narrowed and a narrow frame of the display panel is realized.

DETAILED DESCRIPTION

The present disclosure is further described below in detail in combination with drawings and embodiments. It can be understood that specific embodiments described herein are only used for explaining the present disclosure, not limiting the present disclosure. It should also be noted that, to facilitate description, drawings only show some structures relevant to the present disclosure, not all of the structures.

Figure 1A:
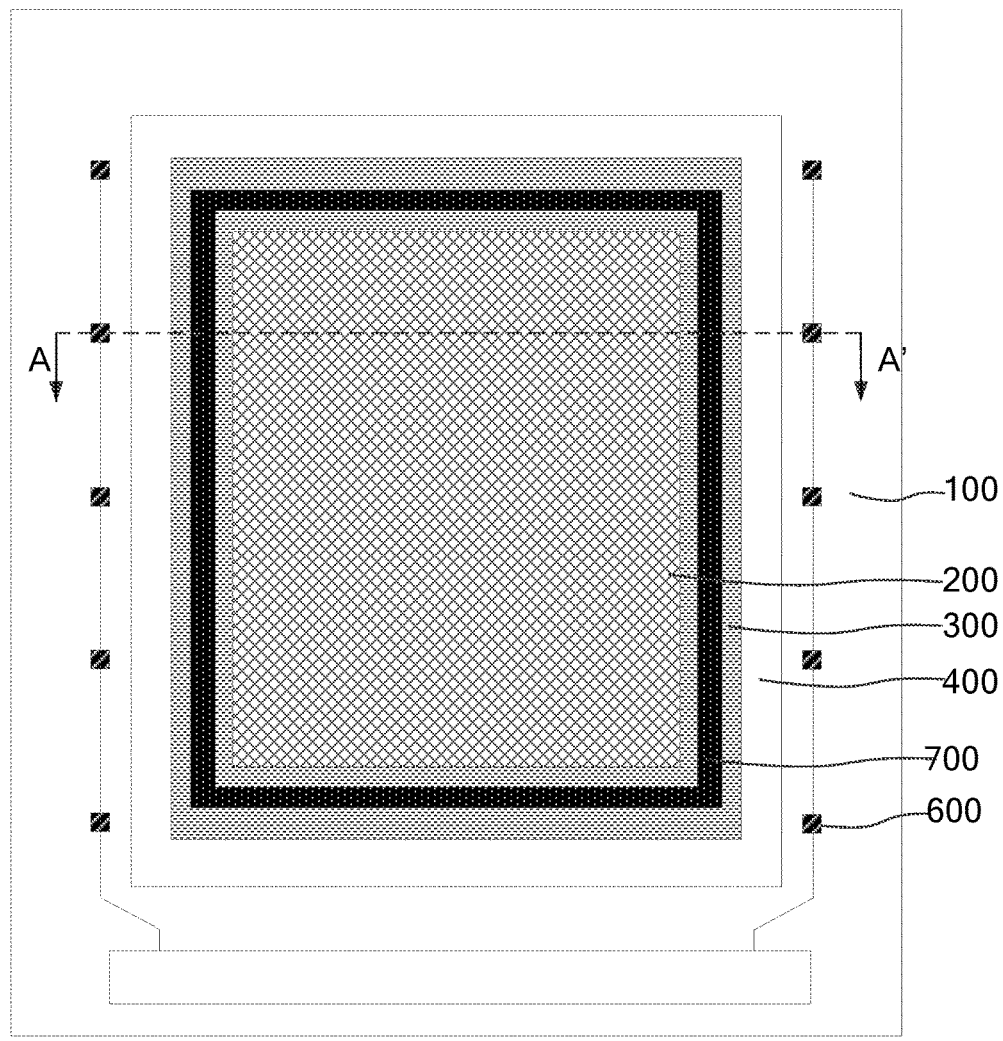
FIG. 1A is a schematic top view illustrating an organic light emitting display in the existing art.
Figure 1B:
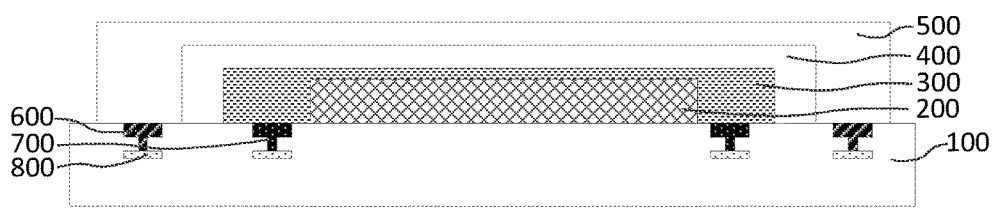
FIG. 1B is a schematic cross sectional view along line A-A' in FIG. 1A.
Figure 2A:
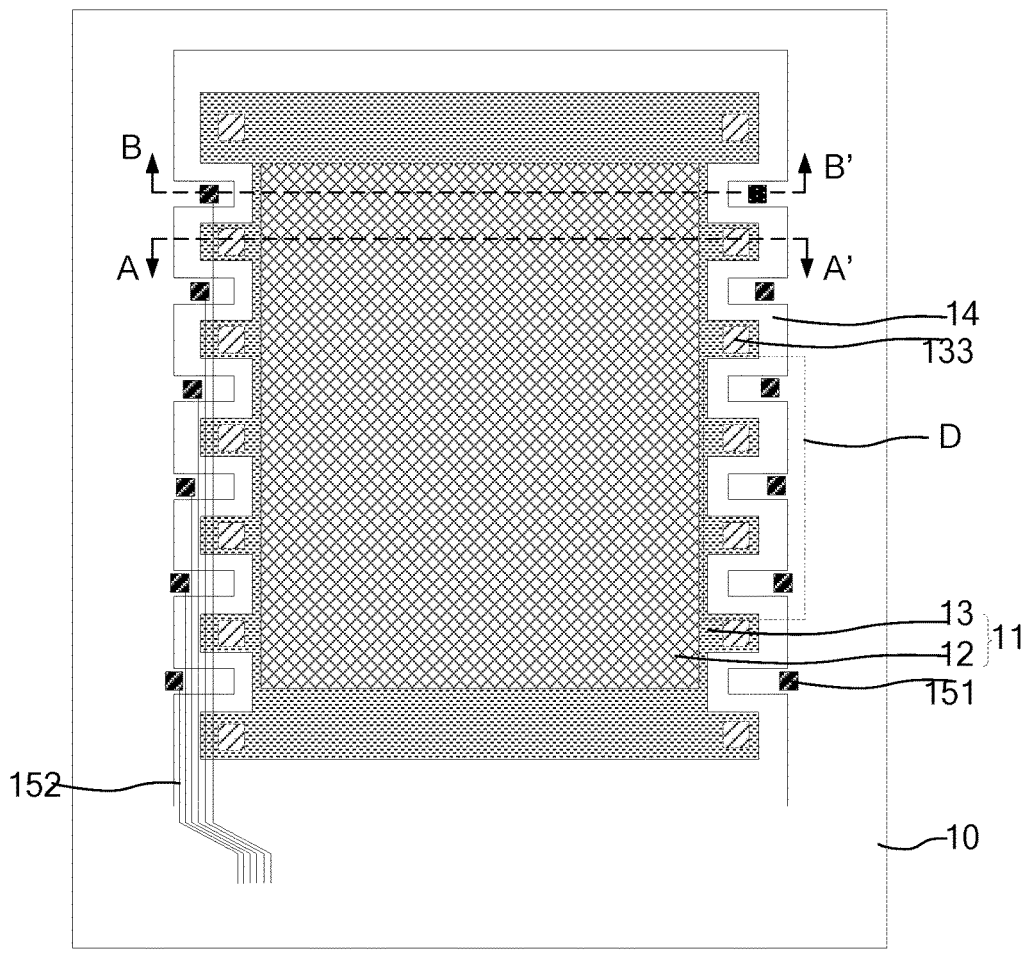
FIG. 2A is a schematic top view illustrating a display panel provided by embodiments of the present disclosure.
Figure 2B:
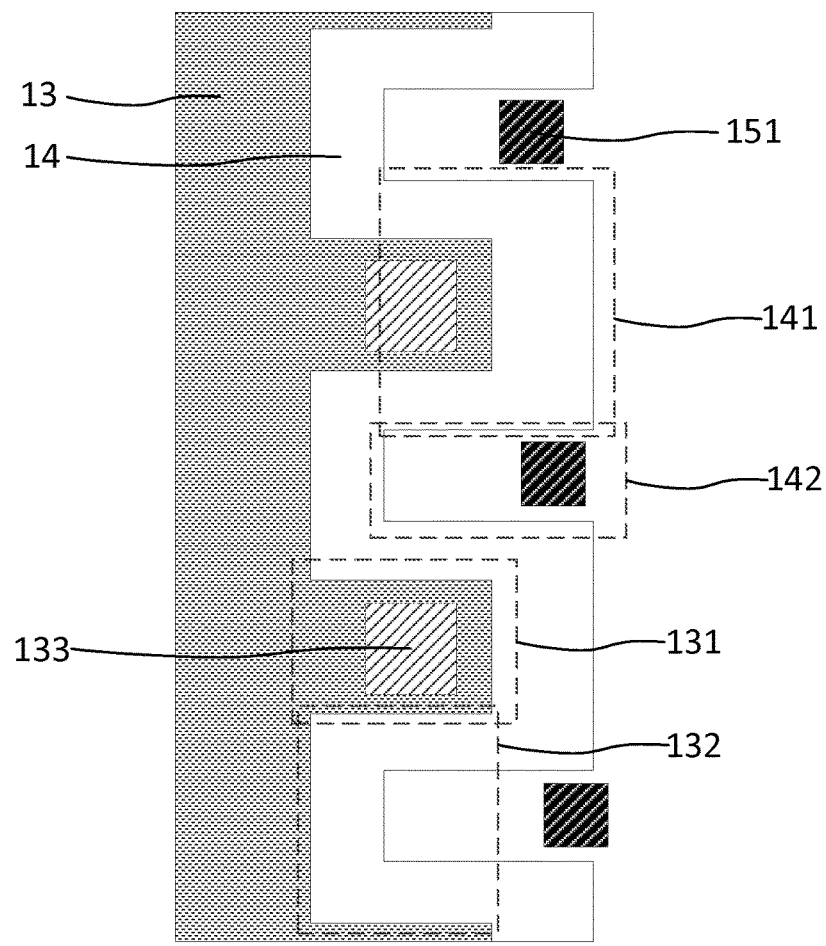
FIG. 2B is a partial enlarged view illustrating position D in FIG. 2A.
Figure 2C:
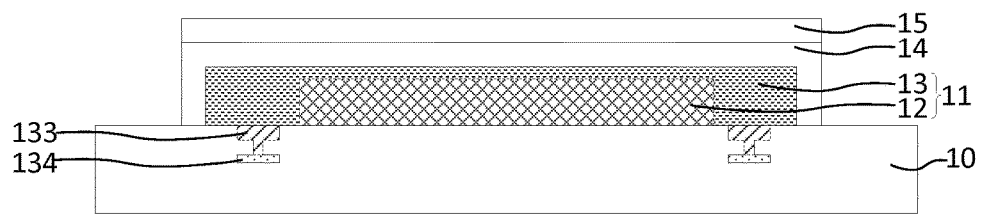
FIG. 2C is a schematic cross sectional view along line A-A' in FIG. 2A.
Figure 2D:
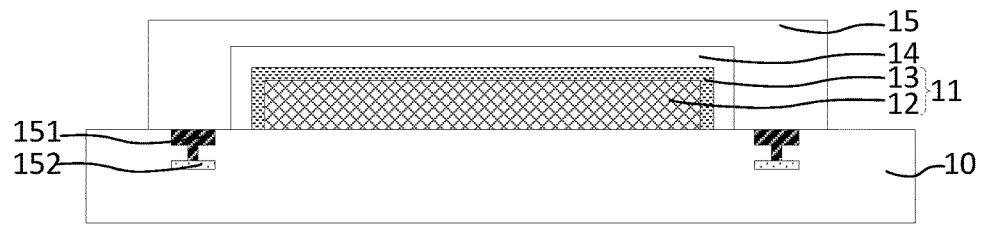
FIG. 2D is a schematic cross sectional view along line B-B' in FIG. 2A.

FIG. 2A is a schematic top view illustrating a display panel provided by embodiments of the present disclosure. FIG. 2B is a partial enlarged view illustrating a position D in FIG. 2A. FIG. 2C is a schematic cross sectional view along line A-A' in FIG. 2A. FIG. 2D is a schematic cross sectional view along line B-B' in FIG. 2A. Referring to FIGS. 2A-2D, the display panel includes:

an array substrate 10;

an organic light emitting layer 11, which is disposed on one side of the array substrate 10 and includes a second electrode 13;

a thin film encapsulation layer 14, which is disposed on one side, facing away from the array substrate 10, of the organic light emitting layer 11, and dads the organic light emitting layer 11; and a touch electrode 15 (not shown in FIG. 2A) disposed on one side, facing away from the array substrate 10, of the thin film encapsulation layer 14.

A border of the second electrode 13 and a border of the thin film encapsulation layer 14 have a concave-convex outline. The concave-convex outline includes convex portions and concave portions. For example, a projection on the array substrate 10 of the second electrode 13 has a concave-convex outline including first convex portions 131 and first concave portions 132. A projection on the array substrate 10 of a part of the border of the thin film encapsulation layer 14 has a concave-convex outline including second convex portions 141 and second concave portions 142. The convex portions of the second electrode 13 are electrically connected with first metal wires 134 located in the array substrate 10 via first through holes 133, and receive a display signal through the first metal wires 134.

The touch electrode 15 is electrically connected with second metal wires 152 located in the array substrate 10 via second through holes 151, and receives and/or transmits a touch signal through the second metal wires 152.

A perpendicular projection on the array substrate of each of the second through holes 151 is not overlapped with a perpendicular projection on the array substrate 10 of the thin film encapsulation layer 14, and the perpendicular projections on the array substrate 10 of at least a part of second through holes 151 are located in the perpendicular projections on the array substrate 10 of the concave portions of the thin film encapsulation layer 14.

In embodiments of the present disclosure, the array substrate may include a base substrate, as well as a thin film transistor array and a storage capacitor disposed on the base substrate. The base substrate may be made of any suitable insulating material with flexibility. For example, a flexible base may be made of a polymer material such as polyimide (PI), polycarbonate (PC), polyethersulfone (PES), polyethylene terephthalate (PET), polyethylene naphthalate (PEN), polyarylate (PAR), glass fiber reinforced plastic (FRP) or the like. The base substrate may be transparent, translucent or opaque. Certainly, the base substrate may also be a glass substrate. In this case, the display panel is rigid and cannot be bent freely.

A buffer layer is disposed on the base substrate. The buffer layer covers the entire upper surface of the base substrate. The buffer layer includes an inorganic layer or an organic layer. For example, the buffer layer may be made of an inorganic material selected from silicon oxide (SiOx), silicon nitride (SiNx), silicon oxynitride (SiOxNy), aluminum oxide (AlOx), aluminum nitride (AlNx) or the like, or an organic material selected from acryl, polyimide (PI), polyester and the like. The buffer layer may include a single layer or a plurality of layers. The buffer layer is configured to block oxygen and moisture, prevent moisture or impurities from diffusing through the flexible base, and provide a flat surface on the upper surface of the flexible base.

The thin film transistor array is disposed on the buffer layer. By taking a top gate type thin film transistor as an example, each thin film transistor in the thin film transistor array includes a semiconductor active layer located on the buffer layer. The semiconductor active layer includes a source region and a drain region formed by doping N-type impurity ions or P-type impurity ions. The region between the source region and the drain region is a channel region in which the impurities are not doped.

The semiconductor active layer is formed by changing amorphous silicon to polycrystalline silicon by crystallization of the amorphous silicon.

In order to crystallize the amorphous silicon, various methods such as a rapid thermal annealing (RTA) method, a solid phase crystallization (SPC) method, an excimer laser annealing (ELA) method, a metal induced crystallization (MIC) method, a metal induced transverse crystallization (MILC) method, a continuous transverse curing (SLS) method and the like can be utilized.

A gate insulation layer covers the semiconductor active layer, includes an inorganic layer of silicon oxide, silicon nitride or metal oxide. The gate insulation layer may include a single layer or a plurality of layers.

A gate electrode is located in a specific region on the gate insulation layer. The gate electrode may include a single layer or a plurality of layers of gold (Au), silver (Ag), copper (Cu), nickel (Ni), platinum (Pt), palladium (Pd), aluminum (Al), molybdenum (Mo) or chromium (Cr), or an alloy such as an aluminum (Al)-neodymium (Nd) alloy and a molybdenum (Mo)-tungsten (W) alloy.

An interlayer insulation layer is disposed on the gate electrode. The interlayer insulation layer may be formed by an inorganic insulating layer of silicon oxide, silicon nitride or the like. Optionally, the interlayer insulation layer may be formed by an organic insulating layer.

A source electrode and a drain electrode are disposed on the interlayer insulation layer. The source electrode and the drain electrode are electrically connected (or bonded) to the source region and the drain region through contact holes, respectively. The contact holes are formed by selectively removing the gate insulation layer and the interlayer insulation layer.

A passivation layer is disposed on the source electrode and the drain electrode. The passivation layer may be formed by an inorganic layer of silicon oxide, silicon nitride or the like or may be formed by an organic layer.

A planarization layer is disposed on the passivation layer. The planarization layer includes an organic layer of acrylic, polyimide (PI), benzocyclobutene (BCB) and the like.

In embodiments of the present disclosure, the organic light emitting layer 11 further includes a first electrode and an organic functional layer 12. The first electrode may be an anode or a cathode. The second electrode 13 may also be the anode or the cathode. When the first electrode is the anode, the second electrode 13 is the cathode. When the first electrode is the cathode, the second electrode 13 is the anode.

The anode may be made of various conductive materials. For example, the anode may be formed as a transparent electrode or a reflective electrode based on use of the anode.

The anode includes indium tin oxide (ITO), indium zinc oxide (IZO), zinc oxide (ZnO), or indium oxide ($In_2O_3$) or the like when being formed as a transparent electrode. When the anode is formed as a reflective electrode, the reflective layer may be formed by Ag, magnesium (Mg), Al, Pt, Pd, Au, Ni, Nd, iridium (Ir), Cr or a mixture thereof, and ITO, IZO, ZnO, or $In_2O_3$ or the like may be formed on the reflective layer.

A pixel defining layer (PDL) covers the border of the anode. The PDL surrounding the border of the anode defines an emission region of each sub-pixel. The PDL may be made of an organic material such as polyimide (PI), polyamide, benzocyclobutene (BCB), acrylic resin, or phenolic resin and the like.

The organic functional layer is disposed on the first electrode. A part, on which the organic functional layer is arranged, of the first electrode is not covered by the PDL and is exposed. The organic functional layer may be formed through a vapor deposition process. The organic functional layer is patterned to correspond to each sub-pixel, namely, correspond to the first electrode being patterned.

The organic light emitting layer 11 is made of a low molecular weight organic material or a high molecular weight organic material. The organic functional layer included in the organic light emitting layer is served as the emission layer, and further includes at least one of a hole injection layer (HIL), a hole transport layer (HTL), an electron transport layer (ETL) and an electron injection layer (EIL). However, besides the emission layer, the organic light emitting layer may include various other functional layers.

The cathode is disposed on the organic light emitting layer 11. Similar to the anode, the cathode may be formed as a transparent electrode or a reflective electrode.

The anode and the cathode are insulated from each other by the organic light emitting layer. If a voltage is applied between the anode and the cathode, the organic light emitting layer emits visible light, thereby realizing an image that can be recognized by the user. The cathode may be formed as the transparent electrode or the reflective electrode.

When the cathode is formed as the transparent electrode, a compound having a small work function of lithium (Li), calcium (Ca), lithium fluoride/calcium (LiF/Ca), lithium fluoride/aluminum (LiF/Al), aluminum (Al), magnesium (Mg) or a combination thereof is initially deposited on the organic light emitting layer through evaporation, and a material such as ITO, IZO, ZnO or $In_2O_3$ or the like for forming the transparent electrode is deposited on the compound.

When the cathode is formed as the reflective electrode, the reflective electrode is formed by evaporating Li, Ca, LiF/Ca, LiF/Al, Al, Mg or a mixture thereof on the entire surface of the flexible base.

The second electrode 13 in the present embodiment is provided as an entire surface. Optionally, the second electrode of the entire surface is the cathode, and the cathodes of all the pixels have a common potential.

The thin film encapsulation layer 14 cladding the organic light emitting layer 11 can prevent external water and oxygen from flowing or diffusing into the organic light emitting layer 11 to damage the organic light emitting layer 11, thereby prolonging the service life of the display panel. The thin film encapsulation layer 14 may include inorganic layers and organic layers. The inorganic layers and the organic layers are stacked in a staggering manner.

Refer back to FIG. 2A, in a process of realizing a touch function, the display panel transmits a touch driving signal to the touch electrode 15 through the second metal wires 152, and detects a touch sensing signal on the touch electrode 15 through the second metal wires 152, so as to determine occurrence of touch and a touch position.

According to embodiments of the present disclosure, since the perpendicular projection on the array substrate 10 of each of the second through holes 151 is not overlapped with the projection on the array substrate of the thin film encapsulation layer 14, the second through holes 151 do not penetrate through the thin film encapsulation layer 14. Therefore, the reliable encapsulation of the thin film encapsulation layer 14 is ensured, thereby effectively preventing moisture and oxygen from entering the organic light emitting layer, and prolonging service life of the display panel. Meanwhile, the perpendicular projections on the array substrate 10 of at least a part of the second through holes 151 are located in the perpendicular projections on the array substrate 10 of the concave portions of the thin film encapsulation layer 14. Since the positions of the second through holes 151 correspond to the concave portion regions of the thin film encapsulation layer 14, the region occupied by the second through holes 151 of the frame is at least partially overlapped with the region occupied by the thin film encapsulation layer 14 of the frame. Therefore, the width of a region, occupied by the second through holes 151 and the thin film encapsulation layer 14, on the display panel is reduced, namely, the frame is narrowed and the narrow frame of the display panel is realized.

It should be noted that the touch electrode 15 is electrically connected with the second metal wires 152 located in the array substrate 10 via the second through holes 151. In FIG. 2A, the second metal wires 152 are only shown on a left side of the figure, and are not shown on a right side of the figure. The second electrode 13 is electrically connected with a driving chip or a flexible circuit board through the first metal wires 134, so as to be provided with a display signal by the driving chip or the flexible circuit board. The touch electrode 15 is electrically connected with the driving chip or the flexible circuit board through the second metal wires 152; so as to be provided with the touch signal by the driving chip or the flexible circuit board or receive the touch signal from the driving chip or the flexible circuit board.

Figure 3A:
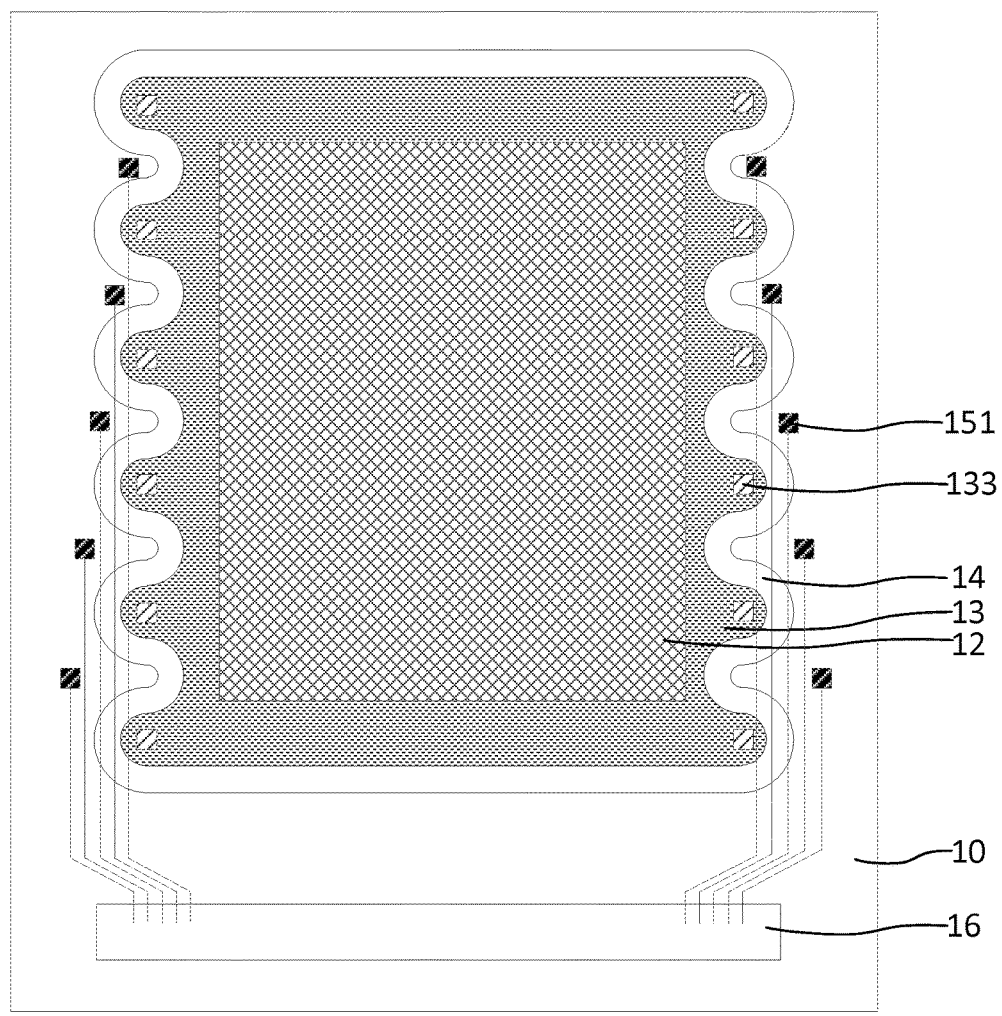
FIG. 3A is a schematic top view illustrating another display panel provided by embodiments of the present disclosure.

Optionally, in embodiments of the present disclosure, the concave-convex outlines of the second electrode 13 and the thin film encapsulation layer 14 are shapes of square wave, circular arc or saw-tooth wave. Exemplarily, referring to FIG. 3A, FIG. 3A is a schematic top view illustrating another display panel provided by embodiments of the present disclosure. It can be seen that the concave-convex outlines are shapes of circular arc. The first metal wires 134 and the second metal wires 152 are electrically connected with the driving chip 16 located in a non-display region so that the driving chip 16 provides the display signal and/or the touch signal.

Figure 3B:
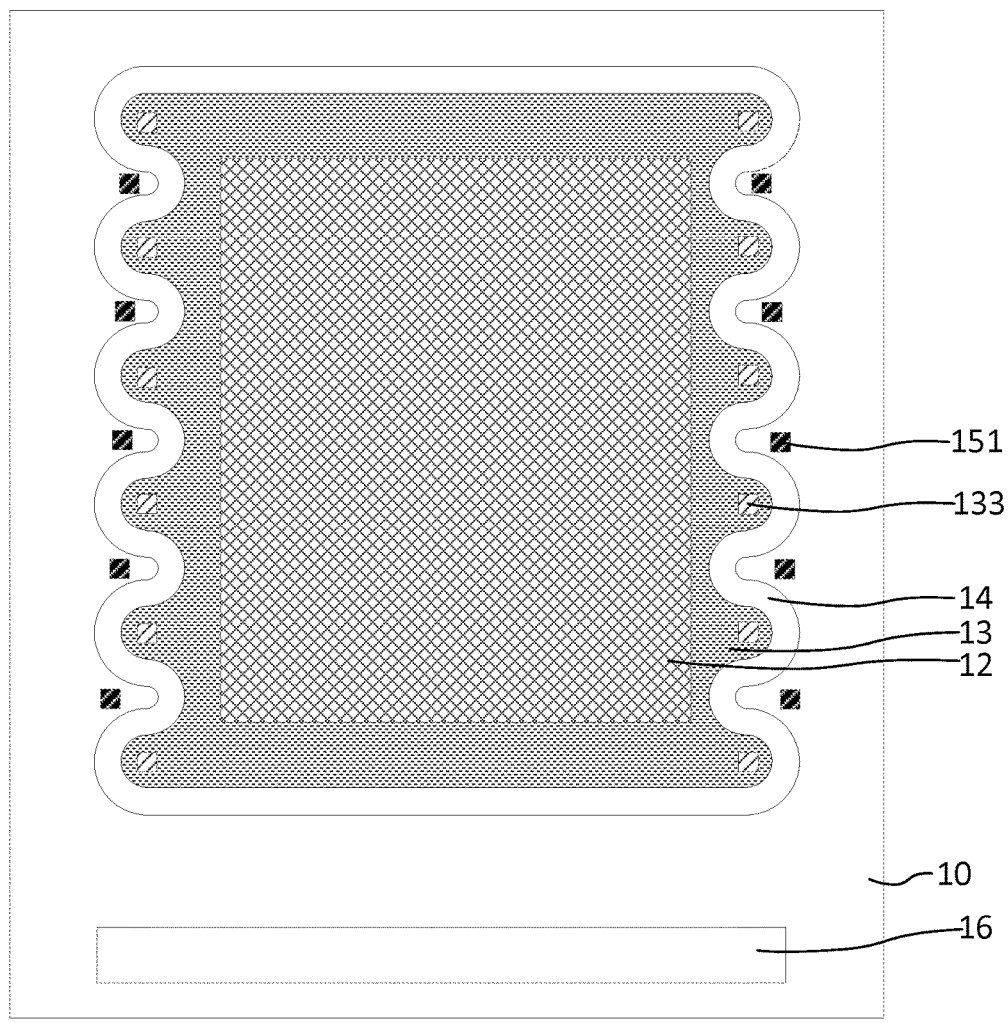
FIG. 3B is a schematic top view illustrating another display panel provided by embodiments of the present disclosure.

In the display panel shown in FIG. 3A, only the perpendicular projections on the array substrate 10 of a part of the second through holes 151 are located in the perpendicular projections on the array substrate 10 of the concave portions of the thin film encapsulation layer 14. In other embodiments of the present disclosure, the perpendicular projection on the array substrate 10 of each of the second through holes 151 is located in the perpendicular projections on the array substrate 10 of the concave portions of the thin film encapsulation layer 14. For example, referring to FIG. 3B, FIG. 3B is a schematic top view illustrating another display panel provided by embodiments of the present disclosure. It can be seen that the perpendicular projection on the array substrate 10 of each of the second through holes 151 is located in the perpendicular projections on the array substrate 10 of the concave portions of the thin film encapsulation layer 14. Therefore, the width of the region, occupied by the second through holes 151 and the thin film encapsulation layer 14, on the display panel is further reduced, so as to reduce the width of the display panel to a greater extent and realize the narrow frame of the display panel. It can be understood that, when the perpendicular projections on the array substrate 10 of the second through holes 151 are all located in the perpendicular projections on the array substrate 10 of the concave portions of the thin film encapsulation layer 14, the second metal wires 152 connected with the touch electrode 15 do not occupy the frame of any display panel, and do not affect a touch scope of the display panel in the display region.

Figure 3C:
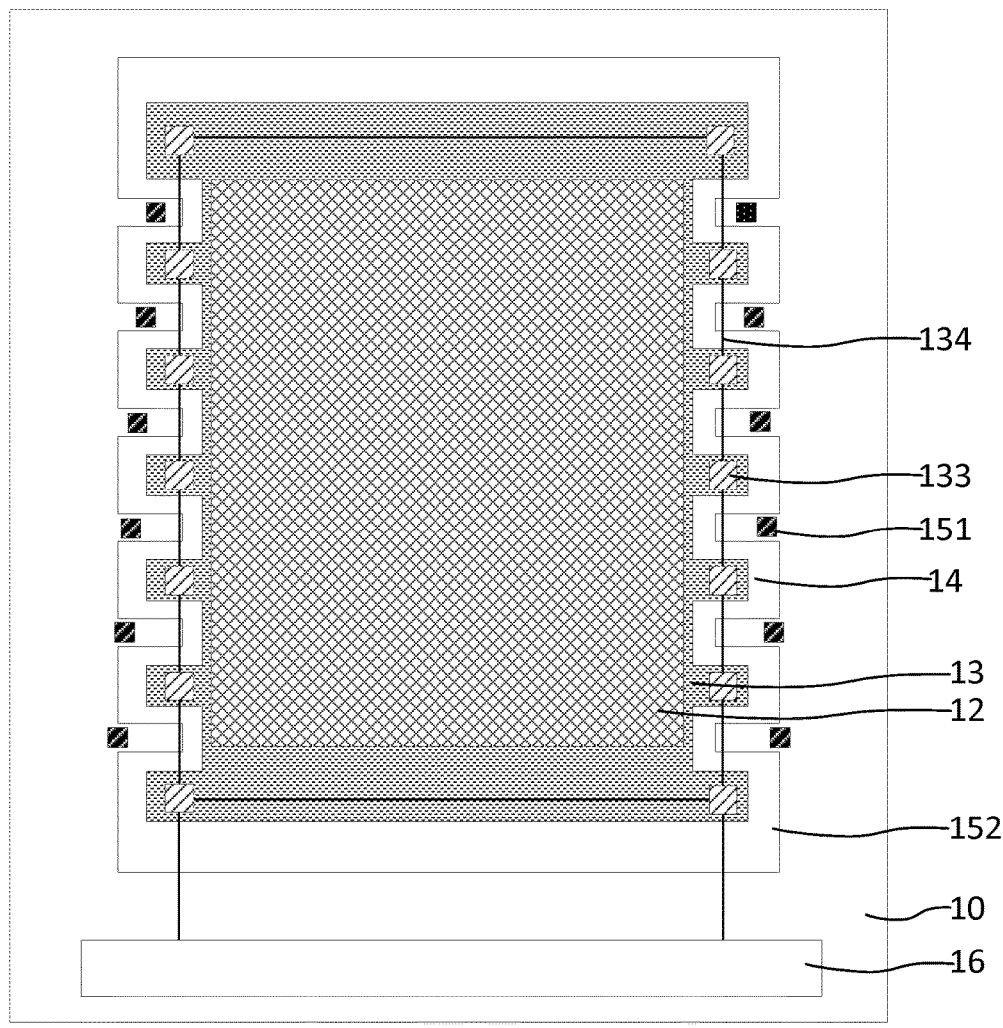
FIG. 3C is a schematic top view illustrating another display panel provided by embodiments of the present disclosure.

FIG. 3C is a schematic top view illustrating another display panel provided by embodiments of the present disclosure. Referring to FIG. 3C, the display panel further includes a display region and a non-display region. A region in which the organic functional layer 12 is located is the display region, and a region outside the organic functional layer 12 is the non-display region. The first metal wires 134 are arranged around the display region. Since the first metal wires 134 are arranged around the display region, a contact area between the first metal wires 134 and the second electrode 13 is increased. Accordingly, a contact resistance between the first metal wires 134 and the second electrode 13 is reduced, and the loss during signal transmission is reduced.

Further, the first metal wires 134 and the second metal wires 152 may be arranged on the same layer. In this way, the display panel is easily thinned, and the first metal wires 134 and the second metal wires 152 may be formed through the same process so as to omit a process step.

In embodiments of the present disclosure, when the second electrode 13 is a cathode, a low-level signal is generally transmitted to the second electrode 13 through the first metal wires 134. The first metal wires 134 and data signal wires of the display panel may be arranged on the same layer. The second metal wires 152 are touch signal wires. The second metal wires 152 and the first metal wires 134 may be arranged on different layers. In general, the number of data signal wires and the number of touch signal wires in the display panel are large. If the first metal wires 134 and the data signal wires are arranged on the same layer, and the first metal wires 134 and the second metal wires 152 are arranged on different layers, then the same film layer does not need to be provided with many wires, thereby reducing occurrence of a short circuit between the wires. Moreover, considering that a certain spacing is further needed between different metal wires, by arranging the first metal wires 134 and the second metal wires 152 on different layers, the width of the region, occupied by the metal wires on the same film layer, of the display panel is not large, and the display panel is easy to realize the narrow frame.

Figure 4A:
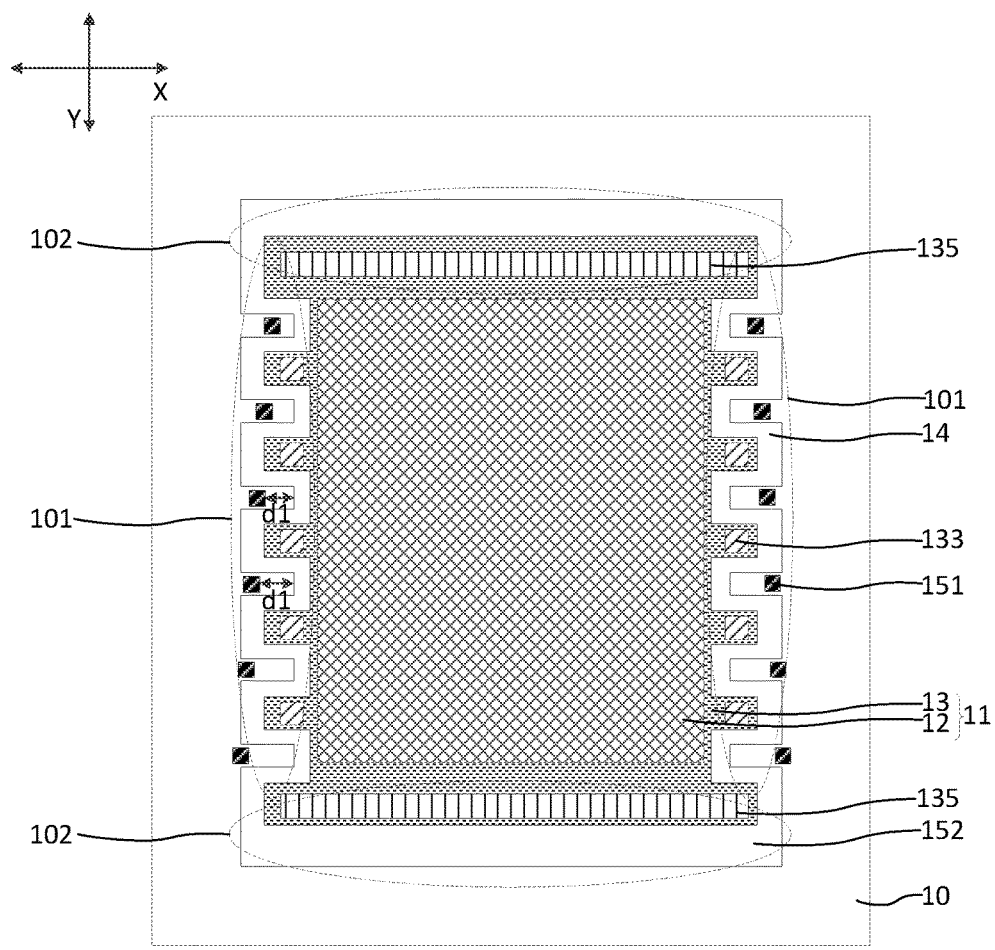
FIG. 4A is a schematic top view illustrating another display panel provided by embodiments of the present disclosure.

In embodiments of the present disclosure, the shape of the thin film encapsulation layer 14 may be the same as the shape of the second electrode 13. It can be understood that, since the thin film encapsulation layer covers the organic light emitting layer, the shape of the border of the thin film encapsulation layer is relevant to the shape of the border of the second electrode. In this way, along a direction in which the convex portions of the second electrode 13 extend to the frame of the display panel, the concave portions of the thin film encapsulation layer 14 correspond to the concave portions of the second electrode 13, and the convex portions of the thin film encapsulation layer 14 correspond to the convex portions of the second electrode 13. Since the thin film encapsulation layer 14 dads the second electrode 13, along a direction perpendicular to the array substrate 10, the convex portions of the thin film encapsulation layer 14 are overlapped with the convex portions of the second electrode 13, and the concave portions of the thin film encapsulation layer 14 are overlapped with the concave portions of the second electrode 13. The concave portions of the thin film encapsulation layer 14 correspond to the second through holes 151, so the thin film encapsulation layer 14 and the second through holes 151 will occupy a small frame of the display panel. FIG. 4A is a schematic top view illustrating another display panel provided by embodiments of the present disclosure. Referring to FIG. 4A, in the display panel, the second electrode 13 and the thin film encapsulation layer 14 both include two first edges 101 and two second edges 102. The two first edges 101 are arranged to be opposite to each other, and the two second edges 102 are arranged to be opposite to each other. An extending direction of the second edges 102 is parallel to a gate line of the display panel. For example, direction X in the figure is a direction parallel to the gate line. The first edges 101 have concave-convex outlines. The touch electrode 15 is electrically connected with the flexible circuit board or the driving chip through the second metal wires 152, and the flexible circuit board or the driving chip is generally arranged in the non-display region in which the second edges 102 are located. The touch electrode 15 extending in the direction X is generally wired on a left frame and a right frame of the display panel (referring to the arrangement of the second metal wire 152 in FIG. 3A). Since the first edges 101 have the concave-convex outlines, the touch electrode 15 may be electrically connected with the second metal wires 152 through the concave portions on the first edges of the thin film encapsulation layer 14, so as to reduce the width of the frames, occupied by the thin film encapsulation layer 14 and the second metal wires 152, of the display panel.

In order to minimize the frame of the display panel, the depth of the concave portion of the thin film encapsulation layer 14 needs to satisfy a certain condition so as to ensure that the perpendicular projections on the array substrate 10 of the second through holes 151 are located in the perpendicular projections on the array substrate 10 of the concave portions of the thin film encapsulation layer 14. Specifically, the depth, in a direction parallel to the gate line of the display panel, of the concave portion of the thin film encapsulation layer 14 is greater than or equal to 32 μm. The diameter of each of the second through holes 151 has a certain width. The depth of the concave portion of the thin film encapsulation layer 14 needs to be greater than the diameter of the second through hole 151 so as to ensure that the perpendicular projections on the array substrate 10 of the second through holes 151 are located in the perpendicular projections on the array substrate 10 of the concave portions of the thin film encapsulation layer 14, thereby realizing the narrow frame of the display panel. Moreover, when the perpendicular projections on the array substrate 10 of the second through holes 151 are located in the perpendicular projections on the array substrate 10 of the concave portions of the thin film encapsulation layer 14, the second metal wires 152 electrically connected with the second through holes 151 generally extend from the second through holes 151 to the region in which the flexible circuit board or the driving chip is located along a direction Y. The second metal wires 152 are required to be arranged at a certain wiring spacing. When the depth of the concave portions of the thin film encapsulation layer 14 is less than 32 μm, the second metal wires 152 cannot be arranged on the premise of narrowing the frame.

Referring back to FIG. 4A, it can be seen that the plurality of first through holes 133 are arranged linearly. For example, the plurality of first through holes 133 are arranged linearly along the direction Y in the figure, and the arrangement direction is perpendicular to the gate line of the display panel. The display panel further includes third through holes 135. The second edges 102 of the second electrode 13 are electrically connected with the first metal wires 134 located in the array substrate 10 via the third through holes 135. The third through holes 135 may increase the contact area between the second electrode 13 and the first metal wires 134, thereby reducing impedance.

Referring back to FIG. 4A, it can be seen that a distance d1 between the second through holes 151 and the concave portions of the thin film encapsulation layer 14 is progressively increased or decreased in the direction perpendicular to the gate line of the display panel, i.e., the direction Y in the figure. Each of the second through holes 151 is generally electrically connected with one of the second metal wires 152. The second metal wires 152 extend along the direction Y, and are arranged along the direction X. The distance d1 between the second through holes 151 and the concave portions of the thin film encapsulation layer 14 is progressively increased or decreased, i.e., the second through holes 151 are staggered along the direction Y, thereby facilitating the wiring design of the second metal wires 152.

Figure 4B:
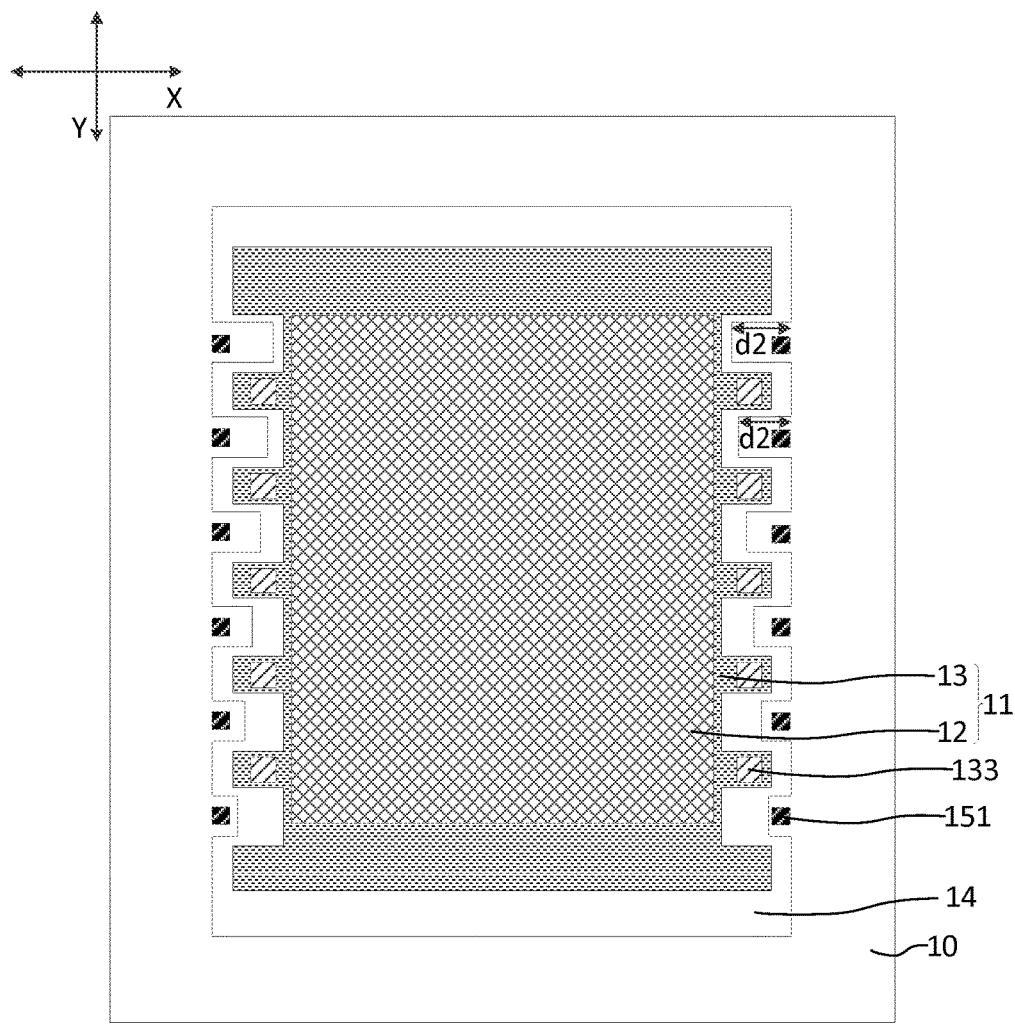
FIG. 4B is a schematic top view illustrating another display panel provided by embodiments of the present disclosure.

FIG. 4B is a schematic top view illustrating another display panel provided by embodiments of the present disclosure. Referring to FIG. 4B, in the display panel, a maximum depth d2, in the direction of the gate line of the display panel, of the concave portions of the thin film encapsulation layer 14 is progressively increased or decreased along the direction Y perpendicular to the gate line of the display panel.

In embodiments of the present disclosure, the second electrode may be the cathode, and the display panel may be a display panel in a form of top emission.

In embodiments of the present disclosure, the touch electrode 15 is in contact with the thin film encapsulation layer 14. After the thin film encapsulation layer 14 is formed, the touch electrode 15 is formed on one side, facing away from the array substrate 10, of the thin film encapsulation layer 14. At this time, the formed touch electrode 15 needs to be electrically connected with the second metal wires 152 in the array substrate 10 via the second through holes 151, so as to transmit the touch signal through the second metal wires 152. In order to ensure the reliable encapsulation of the thin film encapsulation layer 14, the second through holes 151 through which the touch electrode 15 is electrically connected need to keep away from the thin film encapsulation layer 14. The touch electrode 15 needs to be electrically connected with the second through holes 151 from both sides of the thin film encapsulation layer 14 close to the frame of the display panel. The thin film encapsulation layer 14 is provided with the convex portions and the concave portions. The perpendicular projections on the array substrate 10 of the second through holes 151 are not overlapped with the perpendicular projection on the array substrate of the thin film encapsulation layer 14. Moreover, the perpendicular projections on the array substrate 10 of at least a part of the second through holes 151 are located in the perpendicular projections on the array substrate 10 of the concave portions of the thin film encapsulation layer 14. The second through holes 151 through which the touch electrode 15 is electrically connected correspond to the concave portion regions of the thin film encapsulation layer 14. The region of the frame occupied by the second through holes 151 is at least partially overlapped with the region of the frame of the display panel occupied by the thin film encapsulation layer 14. Therefore, the width of the region, occupied by the second through holes 151 and the thin film encapsulation layer 14, of the frame of the display panel is reduced, i.e., the frame is narrowed and the narrow frame of the display panel is realized.

Figure 5:
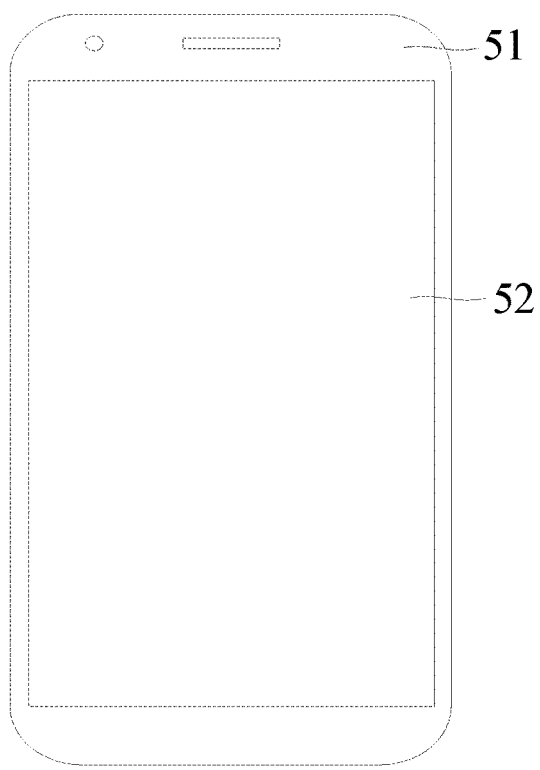
FIG. 5 is a structural schematic diagram illustrating a display device provided by embodiments of the present disclosure.

Embodiments of the present disclosure further provide a display device. Exemplarily, referring to FIG. 5, FIG. 5 is a structural schematic diagram illustrating a display device provided by embodiments of the present disclosure. The display device 51 includes the display panel 52 provided by any embodiment of the present disclosure.

It shall be noted that the above contents are only preferred embodiments of the present disclosure and used technical principles. It can be understood for those skilled in the art that the present disclosure is not limited to specific embodiments herein. For those skilled in the art, the present disclosure can be subjected to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:
1. A display panel, comprising:
an array substrate;
an organic light emitting layer, wherein the organic light emitting layer is disposed on one side of the array substrate, and comprises a second electrode;
a thin film encapsulation layer, wherein the thin film encapsulation layer is disposed on one side, facing away from the array substrate, of the organic light emitting layer, and dads the organic light emitting layer; and
a touch electrode disposed on one side, facing away from the array substrate, of the thin film encapsulation layer, wherein a border of the second electrode and a border of the thin film encapsulation layer each has a concave- convex outline, wherein the concave-convex outline comprises convex portions and concave portions, and the convex portions of the second electrode are electrically connected with a plurality of first metal wires located in the array substrate via a plurality of first through holes;

wherein the touch electrode is electrically connected with a plurality of second metal wires located in the array substrate via a plurality of second through holes, and wherein the touch electrode is configured to receive and/or transmit a touch signal through the second metal wires; and a perpendicular projection on the array substrate of each of the plurality of second through holes is not overlapped with a perpendicular projection on the array substrate of the thin film encapsulation layer; and the perpendicular projections on the array substrate of at least a part of the plurality of second through holes are located in the perpendicular projections on the array substrate of the concave portions of the thin film encapsulation layer.

2. The display panel according to claim 1, wherein the concave-convex outline has a shape selected from at least one of the followings: square waves, circular arcs and saw-tooth waves.

3. The display panel according to claim 1, wherein the perpendicular projections on the array substrate of all of the second through holes are located in the perpendicular projections on the array substrate of the concave portions of the thin film encapsulation layer.

4. The display panel according to claim 1, further comprising a display region and a non-display region, wherein the first metal wires are arranged around the display region.

5. The display panel according to claim 1, wherein the first metal wires and the second metal wires are arranged on the same layer.

6. The display panel according to claim 1, further comprising a plurality of data signal wires, wherein the first metal wires and the plurality of data signal wires are arranged on the same layer, and the second metal wires and the first metal wires are arranged on different layers.

7. The display panel according to claim 1, wherein the shape of the border of the thin film encapsulation layer is the same as the shape of the border of the second electrode.

8. The display panel according to claim 1, wherein the second electrode and the thin film encapsulation layer each comprises two first edges and two second edges, wherein the two first edges are arranged to be opposite to each other, and the two second edges are arranged to be opposite to each other; wherein an extending direction of the second edges is parallel to a gate line of the display panel, and the first edges have the concave-convex outline.

9. The display panel according to claim 8, wherein a depth, in a direction parallel to the gate line of the display panel, of the concave portions of the thin film encapsulation layer is greater than or equal to 32 µm.

10. The display panel according to claim 8, wherein the plurality of first through holes are arranged along a straight line perpendicular to the gate line of the display panel.

11. The display panel according to claim 8, wherein the second edges of the second electrode are electrically connected with the plurality of first metal wires located in the array substrate via a plurality of third through holes.

12. The display panel according to claim 8, wherein a maximum depth, in the direction of the gate line of the display panel, of the concave portions of the thin film encapsulation layer is progressively increased or decreased along the direction perpendicular to the gate line of the display panel.

13. The display panel according to claim 8, wherein a distance between the plurality of second through holes and the concave portions of the thin film encapsulation layer is progressively increased or decreased along the direction perpendicular to the gate line of the display panel.

14. The display panel according to claim 1, wherein the organic light emitting layer further comprises a first electrode and an organic functional layer, wherein the first electrode is an anode, and the second electrode is a cathode.

15. The display panel according to claim 1, wherein the touch electrode is in direct contact with the thin film encapsulation layer.

16. A display device having a display panel, wherein display panel comprises:

an array substrate;

an organic light emitting layer, wherein the organic light emitting layer is disposed on one side of the array substrate, and comprises a second electrode;

a thin film encapsulation layer, wherein the thin film encapsulation layer is disposed on one side, facing away from the array substrate, of the organic light emitting layer, and dads the organic light emitting layer; and a touch electrode disposed on one side, facing away from the array substrate, of the thin film encapsulation layer, wherein a border of the second electrode and a border of the thin film encapsulation layer each has a concave-convex outline, wherein the concave-convex outline comprises convex portions and concave portions, and the convex portions of the second electrode are electrically connected with a plurality of first metal wires located in the array substrate via a plurality of first through holes;

wherein the touch electrode is electrically connected with a plurality of second metal wires located in the array substrate via a plurality of second through holes, and wherein the touch electrode is configured to receive and/or transmit a touch signal through the second metal wires; and a perpendicular projection on the array substrate of each of the plurality of second through holes is not overlapped with a perpendicular projection on the array substrate of the thin film encapsulation layer; and the perpendicular projections on the array substrate of at least a part of the plurality of second through holes are located in the perpendicular projections on the array substrate of the concave portions of the thin film encapsulation layer.

* * * * *